United States Patent
Park

(10) Patent No.: US 11,188,728 B2
(45) Date of Patent: Nov. 30, 2021

(54) DISPLAY DEVICE AND METHOD OF DRIVING THE DISPLAY DEVICE

(71) Applicant: Samsung Display Co., Ltd., Yongin-si (KR)

(72) Inventor: Jong Woong Park, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 349 days.

(21) Appl. No.: 16/133,728

(22) Filed: Sep. 18, 2018

(65) Prior Publication Data

US 2019/0130155 A1    May 2, 2019

(30) Foreign Application Priority Data

Nov. 2, 2017   (KR) .................. 10-2017-0145595

(51) Int. Cl.
*G06K 9/00*       (2006.01)
*H01L 27/32*     (2006.01)
(Continued)

(52) U.S. Cl.
CPC ............. *G06K 9/0004* (2013.01); *G09G 3/32* (2013.01); *G09G 3/3208* (2013.01); *H01L 27/323* (2013.01); *H01L 27/3211* (2013.01); *H01L 27/3227* (2013.01); *G09G 2320/0233* (2013.01); *G09G 2320/043* (2013.01); *G09G 2320/046* (2013.01); *G09G 2320/048* (2013.01);
(Continued)

(58) Field of Classification Search
CPC ......... G06K 9/0004; G09G 2320/0233; G09G 2320/043; G09G 2320/046; G09G 2320/048; G09G 2320/0626; G09G 2354/00; G09G 2360/142; G09G 3/32; G09G 3/3208; H01L 27/3211; H01L 27/3227; H01L 27/323
See application file for complete search history.

(56) References Cited

U.S. PATENT DOCUMENTS 6,747,671 B1   6/2004  Saito
7,675,492 B2   3/2010  Park et al.
(Continued)

FOREIGN PATENT DOCUMENTS

KR   10-2015-0082807      7/2015

OTHER PUBLICATIONS

Partial European Search Report dated Jan. 3, 2019 issued in European Patent Application No. 18203887.7.

*Primary Examiner* — Kim Y Vu
*Assistant Examiner* — Michael J Vanchy, Jr.
(74) *Attorney, Agent, or Firm* — H.C. Park & Associates, PLC

(57) ABSTRACT

A display device includes a display panel having a display area including pixels in a emitting area, a layer disposed on the display panel and including photo sensors to generate sensing signals upon activation thereof, a panel driving unit to supply a first signal, during a first mode, to display an image in the display area, and supply a second signal, during a second mode, to increase the luminance of the emitting area, a detecting unit to perform a fingerprint sensing operation to detect a fingerprint, during the second mode, based on sensing signals received from the photo sensors, and a setting unit to change a characteristic of the emitting area in response to the fingerprint sensing operation.

15 Claims, 7 Drawing Sheets

(51) Int. Cl.
　　　*G09G 3/3208*　　　(2016.01)
　　　*G09G 3/32*　　　　(2016.01)
(52) U.S. Cl.
　　　CPC . *G09G 2320/0626* (2013.01); *G09G 2354/00* (2013.01); *G09G 2360/142* (2013.01)

(56) References Cited

U.S. PATENT DOCUMENTS

| | | | |
|---|---|---|---|
| 9,773,455 B2 | 9/2017 | Chung et al. | |
| 2007/0252005 A1* | 11/2007 | Konicek | G06K 9/00899 235/435 |
| 2010/0149079 A1* | 6/2010 | Yamashita | G09G 3/3233 345/87 |
| 2018/0315799 A1* | 11/2018 | Jiang | G09G 3/3208 |
| 2019/0102063 A1* | 4/2019 | Qian | G06K 9/00006 |

\* cited by examiner

DISPLAY DEVICE AND METHOD OF DRIVING THE DISPLAY DEVICE

CROSS REFERENCE TO RELATED APPLICATION

This application claims priority from and the benefit of Korean Patent Application No. 10-2017-0145595, filed on Nov. 2, 2017, which is hereby incorporated by reference for all purposes as if fully set forth herein.

BACKGROUND

Field

Exemplary implementations of the invention relate generally to a display device and a method of driving the display device, and more specifically, to a display device including a fingerprint sensor and a method of driving the display device.

Discussion of the Background

With the development of information technologies, the importance of a display device as a connection medium between a user and information has been increased. Accordingly, display devices, such as a liquid crystal display device and an organic light emitting display device, are increasingly used.

Recently, demand for display devices that provide various functions, such as fingerprint recognition, have been increasing. In general, a display device capable of fingerprint recognition requires a separate light source, for example, attached to a specific area of a display panel.

The above information disclosed in this Background section is only for understanding of the background of the inventive concepts, and, therefore, it may contain information that does not constitute prior art.

SUMMARY

Display devices constructed according to exemplary implementations of the invention and methods of driving such display devices are capable of recognizing a fingerprint by using light generated in a display panel without use of a separate light source.

Elimination of a separate light source for fingerprint recognition may reduce the thickness and cost of manufacture of a display device. Other advantageous features according to other aspects of exemplary embodiments of the invention include reducing or preventing afterimages and differences in color across pixels that could otherwise arise when using the pixels in the display device to generate light for fingerprint detection.

Additional features of the inventive concepts will be set forth in the description which follows, and in part will be apparent from the description, or may be learned by practice of the inventive concepts.

According to an exemplary embodiment, a display device includes a display panel having a display area including pixels in a emitting area, a layer disposed on the display panel and including photo sensors to generate sensing signals upon activation thereof, a panel driving unit to supply a first signal, during a first mode, to display an image in the display area, and supply a second signal, during a second mode, to increase the luminance of the emitting area, a detecting unit to perform a fingerprint sensing operation to detect a fingerprint, during the second mode, based on sensing signals received from the photo sensors, and a setting unit to change a characteristic of the emitting area in response to the fingerprint sensing operation.

The characteristic may be size and the setting unit may be configured to increase or decrease the size of the emitting area based on the fingerprint sensing operation.

The setting unit may include a sensing counter configured to generate count information indicating a number of times the fingerprint sensing operation is performed, and a size setting unit configured to change the size of the emitting area based on the count information.

The size setting unit may further be configured to increase or decrease the size of the emitting area based on the number of times the fingerprint sensing operation is performed.

The setting unit may further be configured to change the size of the emitting area by a preset range based on the number of times the fingerprint sensing operation is performed.

The preset range may be set to 1% or more of the number of vertical pixels in the display panel.

The setting unit may further be configured to change the size of the emitting area into preset size values based on the number of times of the fingerprint sensing operation is performed.

The photo sensors may be disposed in a sensor area, and the center of the emitting area coincides with the center of the sensor area.

The shape of the emitting area may be one of substantially quadrangular and substantially circular.

Each of the pixels may include a first sub-pixel, a second sub-pixel, and a third sub-pixel to emit, respectively, any one of red, green, and blue light, and the luminance of at least one of the first sub-pixel, the second sub-pixel, and the third sub-pixel may be changed during the second mode.

The display device may further include a color unit to change the luminance of at least one of the first, second, and third sub-pixels during the second mode.

The color matching unit may be configured to set the red light as a reference color, set any one of the green and the blue as a target color, and change the luminance of the target color to match the luminance of the reference color according to $Lt'=Lt*(Tt/Tr)^{(1/Acc\_t)}$, in which $Lt'$ may denote a luminance of the changed target color, $Lt$ may denote a luminance of the target color before the change, $Acc\_t$ may denote a luminance acceleration coefficient of the target color, $Tt$ may denote a degradation coefficient of the target color, and $Tr$ may denote a degradation coefficient of the reference color.

The degradation coefficient may correspond to a time value for emitting light of predetermined luminance.

According to another exemplary embodiment, a display device having an integrated fingerprint sensor and a single light source includes a display panel having a display area including an emitting area and a sensor area, pixels disposed in the display area defining the single light source, and photo sensors disposed in the sensor area to perform a fingerprint sensing operation, and a driving circuit to generate a first signal, during a first mode, to display an image in the display area, generate a second signal, during a second mode, to increase the luminance of the emitting area, and change a characteristic of the emitting area based on performance of the fingerprint sensing operation.

The driving circuit may be configured to increase or decrease the size of the emitting area based on the fingerprint sensing operation.

According to yet another exemplary embodiment, a method of driving a display device including a display panel including pixels and an integrated fingerprint detector having sensors includes the steps of: supplying a first signal to the pixels to display an image; supplying a second signal to the pixels in response to detecting a first touch of an external object on the display panel, the pixels being configured to emit light of a greater luminance in response to the second signal than the first signal; generating a third signal in the sensors in response to light emitted from the pixels and reflected from the external object to the sensors; and detecting a pattern of the object based upon at least one of an amount and a waveform of the reflected light incident onto the sensors.

The steps may further include the step of changing a characteristic of an emitting area on which the pixels are disposed to emit light in response to detecting a second touch subsequent to the first touch.

The steps may further include the step of reverting the characteristic of the emitting area back to its original state in response to detecting a third touch subsequent to the second touch.

According to still another exemplary embodiment, a display device includes a display panel, a plurality of pixels disposed on a first surface of the display panel and spaced apart from each other to emit light of a first luminance when activated by a first signal corresponding to an input image and to emit light of a second luminance greater than the first luminance when activated by a second signal generated when an object touches the display panel, light transmitting regions disposed between the pixels, and a plurality of sensors disposed on a second surface of the display panel between the pixels to overlap the light transmitting region to generate a sensing signal when light of the second luminance is reflected by the object through the display panel onto the sensors.

The object may include ridges and valleys, and the magnitude of the sensing signal generated by the sensors may be different depending on whether the light is reflected by the ridges or valleys of the object.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

Figure 1:
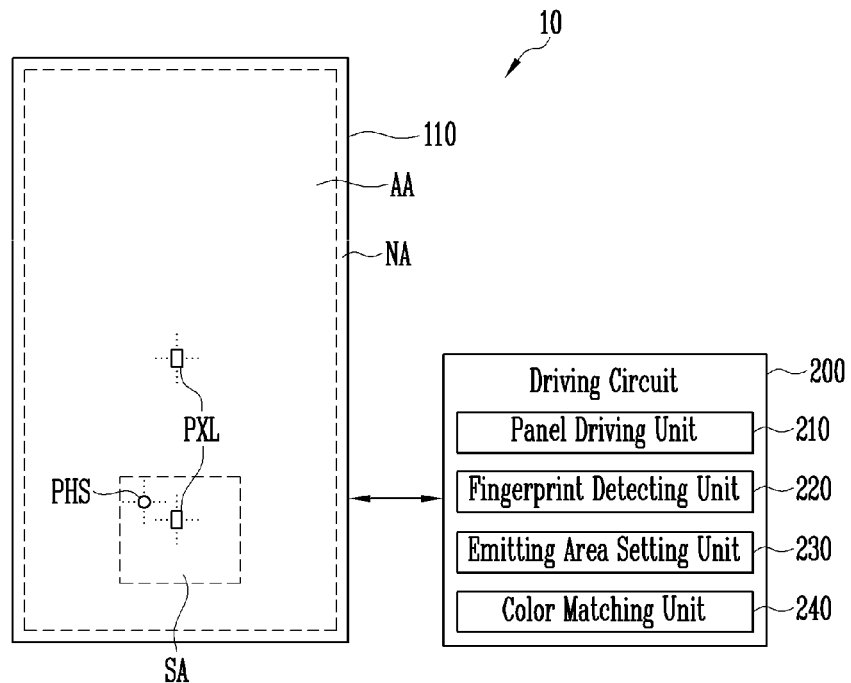
FIGS. 1 and 2 are views schematically showing exemplary embodiments of a display device constructed according to the principles of the invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some exemplary embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the scope of the inventive concepts. Further, the blocks, units, and/or modules of some exemplary embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
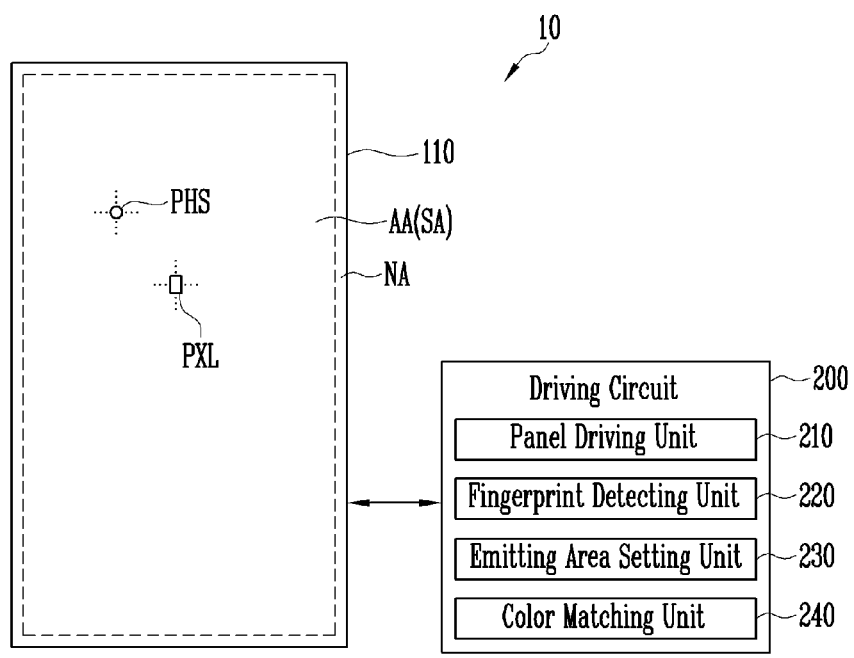

FIGS. 1 and 2 are views schematically showing exemplary embodiments of a display device constructed according to the principles of the invention.

Referring to FIGS. 1 and 2, a display device 10 may include a display panel 110 and a driving circuit 200. FIGS. 1 and 2 show that the display panel 110 and the driving circuit 200 are separated from each other, but the inventive concepts are not limited thereto. For example, a portion of the driving circuit 200 may be integrated into the display panel 110.

The display panel 110 may display an image. The display device 10 may be driven in a first mode or a second mode. The first mode may be a normal display mode for displaying an image corresponding to image data. The second mode may be a fingerprint sensing mode for sensing a fingerprint of a user. In an exemplary embodiment, the display device 10 may be driven in the first mode or in the second mode depending on various preset conditions, such as a preset specific use environment, content, an application program, and/or selection of the user. For example, when an application program that requires user verification to be executed, the mode of the display device 10 may be switched from the first mode to the second mode.

The display panel 110 may include pixels PXL and photo sensors PHS. The display panel 110 may be divided into a display area AA and a non-display area NA. The display area AA is an area in which the pixels PXL are arranged, and may also be referred to as an active area.

The pixels PXL are arranged in the display area AA, and each of the pixels PXL may include at least one light emitting device. As such, the display device 10 may drive the pixels PXL to display an image in the display area AA corresponding to image data input thereto.

The photo sensors PHS may be arranged in the display area AA. More specifically, the photo sensors PHS may be arranged in a sensor area included in the display area AA. As used herein, the sensor area will be described as corresponding to the light emitting area SA described below for convenience of description. The photo sensors PHS may overlap with some of the pixels PXL. The photo sensors PHS may be disposed at the periphery of the pixels PXL. For example, at least some of the photo sensors PHS may be provided between the pixels PXL.

The non-display area NA is disposed at the periphery of the display area AA, and may also be referred to as a non-active area. The non-display area NA may correspond to the area of the display panel 110 remaining except for the display area AA. In some exemplary embodiments, the non-display area NA may include a line area, a pad area, and/or various dummy areas.

A light emitting area SA may be defined by the driving circuit 200, which will be described in more detail later with reference to FIGS. 10A and 10B. For example, the light emitting area SA may be set to be within the display area AA.

According to the illustrated exemplary embodiment, the light emitting area SA may be set as a portion of the display area AA, as shown in FIG. 1. However, the inventive concepts are not limited thereto, and the light emitting area SA may be set to correspond to the entire display area AA, as shown in FIG. 2. In some exemplary embodiments, the light emitting area SA may be set to correspond to the sensor area. For example, the center of the light emitting area SA may be set identical to that of the sensor area. As such, at least a portion of the pixels PXL and the photo sensors PHS may be disposed in the light emitting area SA.

The driving circuit 200 may drive the display panel 110. The driving circuit 200 may drive the display panel 110 in various modes. For example, during the first mode, the driving circuit 200 may supply a normal data signal to the display panel 110 to display an image in the display area AA. In this case, the normal data signal may correspond to image data. The normal data signal may be supplied to the pixels PXL in the display area AA during the first mode.

During the second mode, the driving circuit 200 may supply a sensing data signal to the display panel 110, which may increase the luminance of the light emitting area SA. The sensing data signal may be supplied to pixels PXL in the preset light emitting area SA during the second mode. For example, the voltage of the sensing data signal may be set higher than that of the normal data signal. In addition, the voltage of the sensing data signal may be set for each color (red, green, or blue). The magnitude of the voltage of the sensing data signal may determine the luminance for each color. Also, the sensing data signal may additionally include a predetermined control signal for controlling an emission state or emission timing (e.g., an emission time point and/or an emission time) of the pixels PXL during the second mode.

The display device 10 may recognize a fingerprint of a user as is known in the art. More particularly, during the second mode, the driving circuit 200 may receive a sensing signal from the photo sensor PHS. The driving circuit 200 may detect the shape of a fingerprint of a user using the sensing signal. The driving circuit 200 may include a panel driving unit 210, a fingerprint detecting unit 220, an emitting area setting unit 230, and a color matching unit 240.

In FIGS. 1 and 2, the panel driving unit 210, the fingerprint detecting unit 220, the emitting area setting unit 230, and the color matching unit 240 are shown as being separated from one another, but the inventive concepts are not limited thereto. For example, one or more of the panel driving unit 210, the fingerprint detecting unit 220, the emitting area setting unit 230, and the color matching unit 240 may be integrated with each other.

The panel driving unit 210 may drive the display panel 110 in different modes. During the first mode, the panel driving unit 210 may supply a normal data signal to the pixels PXL while sequentially scanning the pixels PXL of the display area AA to display an image in the display region AA. As such, the display panel 110 may display an image corresponding to image data during the first mode. During the second mode, the panel driving unit 210 may supply a sensing data signal to the pixels PXL disposed in the emitting area SA, such that the luminance of the light emitting area SA is increased.

In accordance to the first or second modes, the panel driving unit 210 may drive the display panel 110 in different manners, by using the same circuit unit (e.g., a scan driving circuit and/or a data driving circuit), or by individual circuit units for each of the first and second modes.

During the second mode, the fingerprint detecting unit 220 may detect a fingerprint of the user based on a sensing signal received from the photo sensors PHS. More particularly, the fingerprint detecting unit 220 may receive a sensing signal and detect a fingerprint (e.g., a fingerprint pattern) of the user based on the sensing signal.

During the second mode, the emitting area setting unit 230 may change characteristics of the light emitting area SA based on a fingerprint sensing operation. For example, the emitting area setting unit 230 may change at least one of the area, shape, and position of the emitting area SA. As used herein, the fingerprint sensing operation may refer to a series of operations sensing a fingerprint during the second mode.

In particular, the emitting area setting unit 230 may increase or decrease the size of the light emitting area SA according to the number of times the fingerprint sensing operation is performed. This will be described in more detail below with reference to FIG. 9.

During the second mode, the color matching unit 240 may change the luminance of each color of the light emitting devices in certain of the pixels. That is, the color matching unit 240 may change the luminance of each color, such that the light emitting devices may have substantially uniform luminance for each color (or have substantially the same degree of degradation for each color).

More particularly, the sensing data signal may include sensing data signals set for respective colors. The color matching unit 240 may adjust the voltage of each sensing data signal supplied for each color, so as to change the luminance of each color. In some exemplary embodiments, the color matching unit 240 may directly adjust the voltage of the sensing data signal, or control the panel driving unit 210 to adjust the voltage of the sensing data signal. However, the inventive concepts are not limited thereto. This will be described in more detail below with reference to FIG. 3.

According to an exemplary embodiment, a fingerprint sensor constructed according to the principles of the invention may use light emitted from the pixels PXL, and thus, may not require any separate external light source for fingerprint recognition.

For example, the fingerprint sensor can be implemented by the pixels PXL and the photo sensors PHS disposed in the display device 10. Accordingly, the thickness of the display device 10 may be decreased, which may also reduce manufacturing costs of the display device 10.

Further, according to an exemplary embodiment, the size of the light emitting area SA may be changed each time the fingerprint sensing operation is performed during the period when the display device 10 is driven in the second mode. Accordingly, an afterimage that may occur from device degradation at a boundary portion of the light emitting area SA may be reduced. In addition, the luminance of each color may be changed during when the display device 10 is driven in the second mode, which may prevent a color difference phenomenon from occurring.

The exemplary structure of a fingerprint sensor and fingerprint sensing principles according to exemplary embodiments of the invention will be described in detail later.

Figure 3:
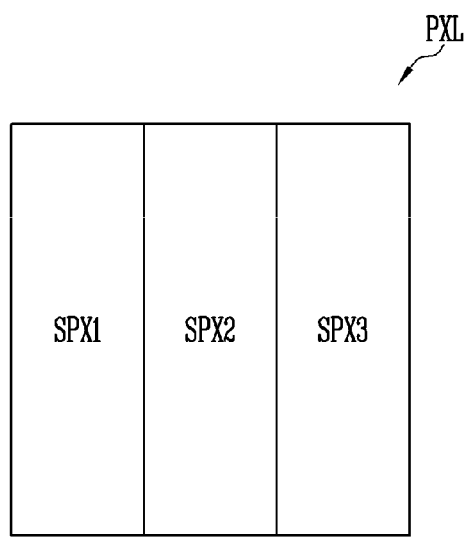
FIG. 3 is a view schematically showing a pixel according to an exemplary embodiment of the invention.

FIG. 3 schematically illustrates a pixel PXL according to an exemplary embodiment. FIG. 3 shows that the pixel PXL includes three elongated, strip-type sub-pixels SPX1, SPX2, and SPX3, but the inventive concepts are not limited thereto. For example, the shape of the pixel PXL, the arrangement structure of sub-pixels, and/or the number of sub-pixels may be variously modified.

Referring to FIG. 3, the pixel PXL includes a plurality of sub-pixels SPX1, SPX2, and SPX3. For example, the pixel PXL may include first, second, and third sub-pixels SPX1, SPX2, and SPX3 that emit light of different colors.

Each of the sub-pixels SPX1, SPX2, and SPX3 may include at least one light emitting device. For example, the first sub-pixel SPX1 may include a light emitting device that emits light of a first color (e.g., red), the second sub-pixel SPX2 may include a light emitting device that emits light of a second color (e.g., green), and the third sub-pixel SPX3 may include a light emitting device that emits light of a third color (e.g., blue). However, the inventive concepts are not limited thereto, and the first to third sub-pixels SPX1, SPX2, and SPX3 may all include light emitting devices that emit light of white color, and the color of light emitted from each of the sub-pixels SPX1, SPX2, and SPX3 may be controlled by a color filter, etc. As described above, the pixel PXL can emit light of various colors by the sub-pixels SPX1, SPX2, and SPX3 emitting light of different colors.

Referring to FIGS. 1 to 3, the first sub-pixel SPX1 may be supplied with a first sensing data signal, the second sub-pixel SPX2 may be supplied with a second sensing data signal, and the third sub-pixel SPX3 may be supplied with a third sensing data signal.

The first sub-pixel SPX1 may emit light with a luminance corresponding to the voltage of the first sensing data signal. The second sub-pixel SPX2 may emit light with a luminance corresponding to the voltage of the second sensing data signal. The third sub-pixel SPX3 may emit light with a luminance corresponding to the voltage of the third sensing data signal.

The color matching unit 240 may change the luminance of the first sub-pixel SPX1 (e.g., the luminance of red light) by changing the voltage of the first sensing data signal. The color matching unit 240 may change the luminance of the second sub-pixel SPX2 (e.g., the luminance of green light) by changing the voltage of the second sensing data signal. The color matching unit 240 may change the luminance of the third sub-pixel SPX3 (e.g., the luminance of blue light) by changing the voltage of the third sensing data signal. In this manner, during the second mode, the color matching unit 240 may change the luminance of each color.

Figure 4:
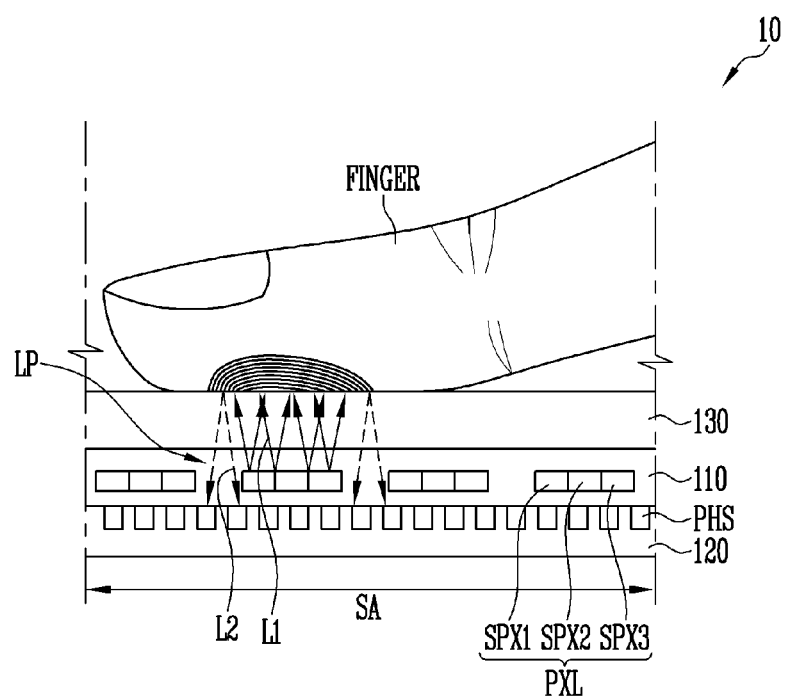
FIG. 4 is a cross-sectional view a display device according to an exemplary embodiment of the invention.

FIG. 4 is a cross-sectional view of a display device 10 according to an exemplary embodiment of the invention. In FIG. 4, components substantially similar or identical to those in FIGS. 1 to 3 are designated by like reference numerals, and thus, repeated descriptions thereof will be omitted to avoid redundancy.

Referring to FIG. 4, the display device 10 may include a display panel 110, a sensor layer 120, and a window 130. The display panel 110 may include pixels PXL and a light-emitting portion LP. The pixels PXL may be disposed in the light emitting area SA.

The light-emitting portion LP may be provided at the periphery of the pixels PXL. In some exemplary embodiments, the light-transmitting portion LP may be disposed in an area where light blocking elements, such as circuit devices (e.g., electrodes of a transistor, a capacitor, and/or a light emitting device) forming each pixel PXL (or each sub-pixel SPX1, SPX2, or SPX3) and/or lines (e.g., a scan line, a data line, a control line, and/or a power line) coupled thereto, are not disposed. That is, the display area AA may include light-transmitting areas through which light may be transmitted. The light-transmitting portion LP may be disposed in the light-transmitting areas of the display panel 110.

The light-emitting portion LP may include an area of the display panel 110 on which only transparent components (e.g., an insulating layer. etc.) are disposed, or an area on which opaque or translucent components are disposed and has light transmittance greater than 0%, thereby transmitting some of light generated from the display panel 110 or incident to the display panel 110.

For example, the light-transmitting portion LP may be disposed between light emitting portions (e.g., areas where emitting layers of the pixels PXL are disposed and through which light is emitted to the outside from the display panel 110) of the pixels PXL and/or in an area overlapping a pixel defining layer disposed between the pixels PXL. More particularly, the light-transmitting portion LP may be disposed in at least one of inside and periphery of each of the pixels PXL (or the sub-pixels SPX1, SPX2, and SPX3) and between adjacent pixels PXL (or sub-pixels SPX1, SPX2, and SPX3) in the display area AA.

When the display device 10 constructed according to the principles of the invention is driven in the second mode, pixels PXL disposed in a predetermined light emitting area SA may emit light L1, and at least some of light L2 reflected by a fingerprint of a user may be incident into the display panel 110 through the light-transmitting portion LP. In addition, at least some of the light L2 reflected by the fingerprint into the display panel 110 may be incident upon the photo sensors PHS through the light-transmitting portion LP.

The sensor layer 120 may be disposed on one surface of the display panel 110. The sensor layer 120 may include a plurality of photo sensors PHS disposed on the one surface of the display panel 110. For example, the sensor layer 120 may be provided on a rear surface (e.g., a surface opposing a surface on which an image is displayed) of the display panel 110. A sensor IC may further be disposed on the sensor layer 120 attached to the rear surface of the display panel 110. In this manner, the image quality of the display device 10 may be prevented from being degraded by the sensor layer 120.

The photo sensors PHS may be arranged in a sensor area included in the display area AA. In some exemplary embodiments, the light emitting area SA may be set to correspond to the sensor area. For example, the center of the light emitting area SA may be set to be identical to (or coincide with) the center of the sensor area.

In some exemplary embodiments, at least some of the photo sensors PHS may overlap with at least a portion of the light-transmitting portion LP, and receive light passing through the light-transmitting portion LP. For example, at least some of the photo sensors PHS may receive light L2 reflected by a finger of the user, and supply a sensing signal corresponding to the reflected light L2 to the driving circuit 200. As described above, in the display device 10 constructed according to the principles of the invention, a fingerprint sensor can be implemented with the pixels PXL and the photo sensors PHS disposed in the light emitting area SA without any separate external light source.

The size, number, arrangement form, and/or density (e.g., resolution) of the photo sensors PHS may be varied. For example, the photo sensors PHS may have one-to-one correspondence to each of the pixels PXL or each of the sub-pixels SPX1, SPX2, and SPX3. Alternatively, the number of the photo sensors PHS may be less than that of the pixels PXL or the sub-pixels SPX1, SPX2, and SPX3, and may be spaced apart from each other according to a predetermined distance or distribution density. Still alternatively, the number of the photo sensors PHS may be greater than that of the pixels PXL or the sub-pixels SPX1, SPX2, and SPX3, and may be densely disposed in the emitting area SA. In some exemplary embodiments, the photo sensors PHS may be disposed in the sensor layer 120 to form a sensor array with a density sufficient to detect the shape of a fingerprint.

The window 130 may be disposed on the other surface (e.g., upper surface) of the display panel 110. In some exemplary embodiments, the window 130 may be disposed on a surface of the display panel 110 opposing a surface on which the sensor layer 120 is disposed. For example, the window 130 may be disposed on a front surface (e.g., a surface on which an image is displayed) of the display device 10. In some exemplary embodiments, the window 130 may be omitted.

Hereinafter, a method of sensing a fingerprint according to exemplary embodiments will be described. As described in FIGS. 1 and 2, when the display device 10 is driven in the second mode, the panel driving unit 210 may supply a sensing data signal to the display panel 110. In some exemplary embodiments, the sensing data signal may cause the pixels PXL disposed in the light emitting area SA to emit light. For example, if the sensing data signal is supplied, the pixels PXL disposed in the predetermined light emitting area SA may emit light L1.

In some exemplary embodiments, the pixels PXL may emit light with a luminance corresponding to the voltage of the sensing data signal. That is, during the second mode, emission of light from the pixels PXL in the light emitting area SA may be controlled by the sensing data signal, which may change the luminance of the pixels PXL.

When a user places a finger on the emitting area SA, at least some of the light L1 emitted from the pixels PXL in the light emitting area SA may be reflected by the finger (particularly, a fingerprint part) of the user, and at least some of the reflected light L2 may pass through the light-transmitting portion LP. The reflected light L2 passing through the light-transmitting portion LP may be incident onto the photo sensors PHS. In response to the reflected light L2 incident onto the photo sensors PHS, the photo sensors PHS may supply sensing signals. Meanwhile, the photo sensors PHS may be arranged at a density sufficient to identify a fingerprint.

Thus, the driving circuit 200 constructed according to the principles of the invention can detect a fingerprint of the user based on the sensing signals input from the photo sensors PHS. More specifically, light L1 may be respectively reflected differently from the ridges and valleys of the fingerprint. Accordingly, the fingerprint detecting unit 220 can detect the shape of a fingerprint (or a fingerprint pattern) by detecting the amount of the reflected light L2 incident upon the photo sensor PHS at each position and/or the waveform of the reflected light L2 to distinguish the ridges and valleys of the fingerprint.

Figure 5A:
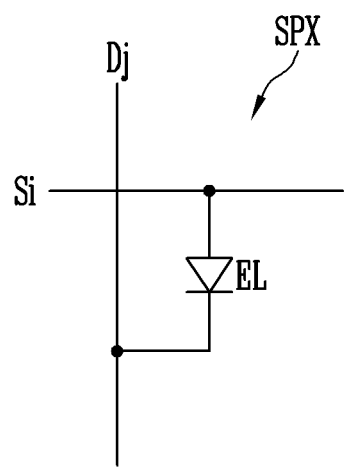
FIGS. 5A and 5B are views illustrating sub-pixels according to exemplary embodiments of the invention.
Figure 5B:
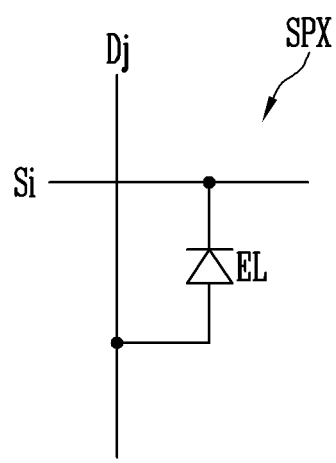

FIGS. 5A and 5B each illustrate a sub-pixel according to exemplary embodiments of the invention. In FIGS. 5A and 5B, an arbitrary sub-pixel is shown to be coupled to an $i^{th}$ (i is a natural number) horizontal line (horizontal pixel column) and $j^{th}$ (j is a natural number) vertical line (vertical pixel column). In some exemplary embodiments, any one of the first to third sub-pixels SPX1, SPX2, and SPX3 may have the structure of a sub-pixel shown in FIG. 5A or 5B, but the inventive concepts are not limited thereto. As used herein, a sub-pixel may be a type of a pixel or a part thereof, and thus, the structure and driving method of the sub-pixel described below may also be applied to a pixel PXL in a substantially similar manner.

Referring to FIGS. 5A and 5B, each sub-pixel SPX includes a light emitting device EL coupled between a scan line Si and a data line Dj. In some exemplary embodiments, the light emitting device EL may be an organic light emitting diode (OLED), but the inventive concepts are not limited thereto.

As shown in FIG. 5A, a first electrode (e.g., an anode electrode of the light emitting device EL) may be coupled to the scan line Si, and a second electrode (e.g., a cathode electrode of the light emitting device EL) may be coupled to the data line Dj. In some exemplary embodiments, the coupling direction of the organic light emitting device EL may be varied. For example, as shown in FIG. 5B, the anode electrode of the light emitting device EL may be coupled to the data line Dj, and the cathode electrode of the light emitting device EL may be coupled to the scan line Si.

The sub-pixel SPX may be activated with a scan signal and a normal data signal, respectively, from the scan line Si and the data line Dj, and emits light corresponding to the scan signal and the data signal. For example, when a forward voltage equal to or greater than a threshold voltage is applied between the first electrode and the second electrode, the light emitting device EL may emit light with a luminance corresponding to the magnitude of the applied voltage. In some exemplary embodiments, the voltage of the normal data signal applied to the data line Dj may be varied to control the light emission of each sub-pixel SPX.

Figure 6:
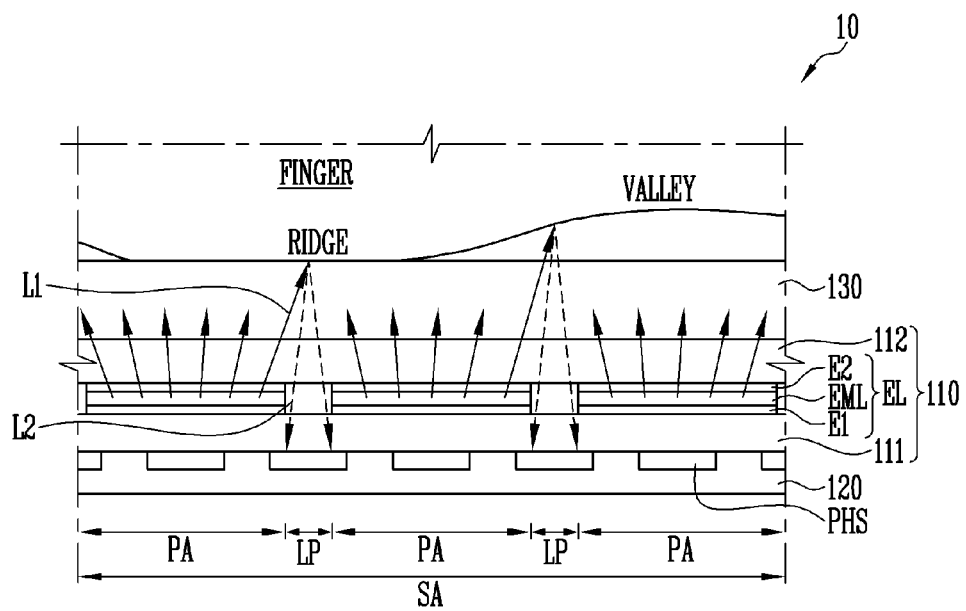
FIG. 6 is a cross-sectional view of a light emitting area of a display device according to an exemplary embodiment of the invention.

FIG. 6 is a cross-sectional view of a light emitting area of a display device according to an exemplary embodiment of the invention. In FIG. 6, components substantially similar or identical to those in FIGS. 1 to 5B are designated by like reference numerals, and thus, repeated descriptions thereof will be omitted to avoid redundancy.

Referring to FIG. 6, a display panel 110 may include a first substrate 111, a second substrate 112, and light emitting devices EL. The light emitting devices EL may be disposed in unit pixel areas PA (e.g., pixel areas or sub-pixel areas), respectively, and between the first substrate 111 and the second substrate 112.

Each of the light emitting devices EL may include first and second electrodes E1 and E2 and a light emitting layer EML. Referring to FIGS. 5A and 5B, in some exemplary embodiments, the first electrode E1 and the second electrode E2 may be coupled to the scan line Si and the data line Dj, respectively.

The emitting layer EML may be disposed between the first electrode E1 and the second electrode E2. When the display device 10 is driven in the second mode, a sensing data signal supplied to the display panel 110 may cause the light emitting devices EL disposed in a light emitting area SA to emit light. At this time, light L2 reflected from ridges and valleys of a fingerprint of a user is modulated to have different magnitudes (or amplitudes) and/or different phases, and accordingly, the fingerprint of the user can be detected.

For example, during the period in which the second mode is executed, a sensing data signal may be supplied to the data lines Dj of sub-pixels SPX (or pixels PXL) disposed in the light emitting area SA. The pixels PXL may emit light with a luminance corresponding to the voltage of the sensing data signal.

In some exemplary embodiments, each of the first substrate 111 and the second substrate 112 may be a light transmissive substrate, and may include a transparent or translucent material. Alternatively, each of the first substrate 111 and the second substrate 112 may be a rigid or flexible substrate, and its material is not particularly limited. Still alternatively, at least one of the first substrate 111 and the second substrate 112 may include at least one insulating layer. For example, the second substrate 112 may have a thin film encapsulation layer including one or more organic layers and one or more inorganic layers.

Figure 7:
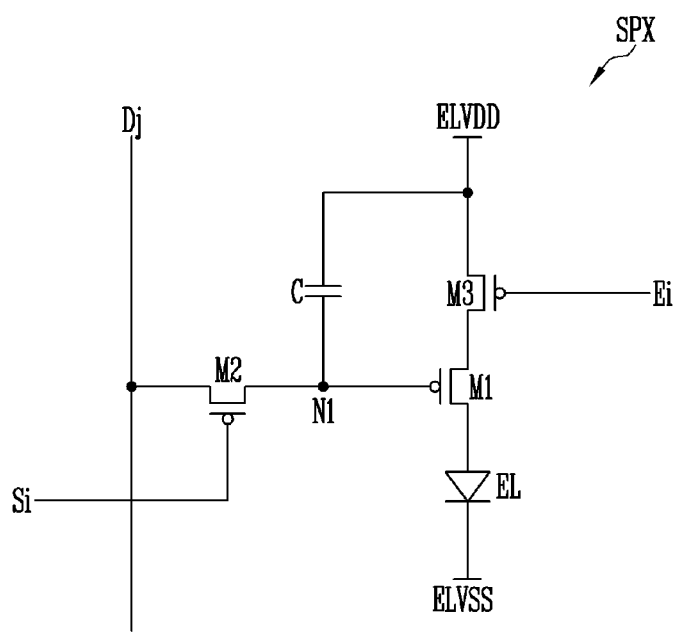
FIG. 7 is a view illustrating a sub-pixel according to an exemplary embodiment of the invention.
Figure 8:
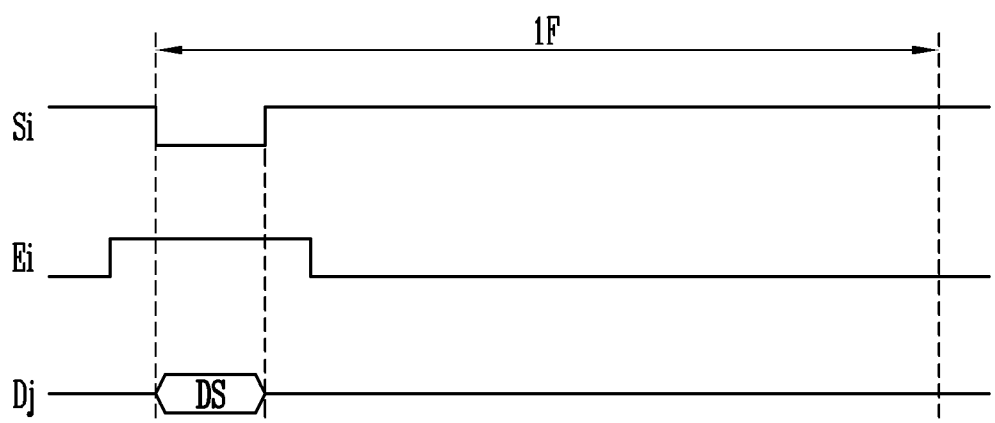
FIG. 8 is a view showing a waveform of signals applied to the sub-pixel of FIG. 7 according to an exemplary embodiment of the invention.

FIG. 7 illustrates a sub-pixel SPX according to an exemplary embodiment of the invention. FIG. 8 is a graph showing waveforms of signal applied to the sub-pixel SPX of FIG. 7. The sub-pixel of FIG. 7 may be any one of the first to third sub-pixels SPX1, SPX2, and SPX3 (or pixel PXL) described above, but is not limited to a specific sub-pixel.

Referring to FIG. 7, each sub-pixel SPX (or pixel PXL) may include a light emitting device EL, first to third transistors M1, M2, and M3, and a capacitor C, which may be disposed in a corresponding pixel area PA between the first and second substrates 111 and 112.

The light emitting device EL may be coupled between a first power source ELVDD and a second power source ELVDD, and emit light according to a driving current supplied through the first transistor M1. The first power source ELVDD and the second power source ELVSS have different voltage levels. For example, the second power source ELVSS may have a voltage level lower than that of the first power source ELVDD by the threshold voltage of the light emitting device EL.

The first transistor (driving transistor) M1 may be coupled between the first power source ELVDD and the light emitting device EL. In addition, a gate electrode of the first transistor M1 may be coupled to a first node N1. The first transistor M1 controls a driving current flowing through the light emitting device EL in accordance with the voltage of the first node N1. For example, the first transistor M1 may control the supply and/or magnitude of the driving current in accordance with the voltage of the first node N1.

The second transistor (switching transistor) M2 may be coupled between a data line Dj and the first node N1. In addition, a gate electrode of the second transistor M2 may be coupled to a scan line Si. The second transistor M2 may be turned on when a scan signal is supplied to the scan line Si to allow the data line Dj and the first node N1 to be electrically coupled to each other. In this manner, when the second transistor M2 is turned on, a data signal DS (e.g., a normal data signal or a sensing data signal) supplied to the data line Dj may be transferred to the first node N1.

The third transistor (emission control transistor) M3 is disposed in a current path of the driving current flowing through the light emitting device EL. For example, the third transistor M3 may be coupled between the first power source ELVDD and the first transistor M1. Alternatively, in another exemplary embodiment, the third transistor M3 may be coupled between the first transistor M1 and the light emitting device EL. In addition, a gate electrode of the third transistor M3 may be coupled to an emission control line Ei.

In some exemplary embodiments, an emission control signal for controlling an emission state or an emission timing (e.g., an emission time point and emission time) of each sub-pixel SPX, corresponding to the first mode and/or the second mode, may be supplied to the emission control line Ei. More specifically, the third transistor M3 may be turned off when the emission control signal having a gate-off voltage is supplied to the emission control line Ei, which may block the current path of the driving current from being formed in the sub-pixel SPX. The third transistor M3 may be turned on when the emission control signal having a gate-on voltage is supplied to the emission control line Ei, which may form the current path.

The capacitor C may be coupled between the first power source ELVDD and the first node N1. The capacitor C may store a voltage corresponding to the data signal DS supplied to the first node N1, and maintain the stored voltage until a data signal DS of a next frame is supplied.

Referring to FIG. 8, the scan signal may be supplied to the scan line Si during each frame period. The scan signal having the gate-on voltage (e.g., a low voltage) may be sequentially supplied to the scan line Si of each horizontal line (horizontal pixel column) during one frame period 1F. That is, in some exemplary embodiments, the scan signal may be supplied to a sub-pixel SPX during a horizontal period of one frame period 1F that corresponds to the sub-pixel SPX.

When the scan signal is supplied to the scan line Si, the second transistor M2 may be turned on. Accordingly, as the data line Dj and the first node N1 are electrically coupled to each other, the data signal DS from the data line Dj may be supplied to the first node N1. At this time, the capacitor C may store a voltage corresponding to the data signal DS (e.g., a voltage corresponding to a difference between the voltage of the first power source ELVDD and the voltage of the data signal DS).

In some exemplary embodiments, the emission control signal having the gate-off voltage (e.g., a high voltage) may be supplied to the emission control line Ei at least during a period when the scan signal is supplied. When the emission control signal having the gate-off voltage is supplied to the emission control line Ei, the third transistor M3 may be maintained in an off-state. Accordingly, the voltage of the data signal DS can stably stored in the capacitor C, and it is possible to prevent the sub-pixel SPX from emitting light with an unwanted luminance during when the data signal DS is stored in the capacitor.

After a voltage corresponding to the data signal DS is stored in the capacitor C, the supply of the scan signal may be stopped. Accordingly, the second transistor M2 may be turned off.

After the second transistor M2 is turned off, when the emission control signal having the gate-on voltage (e.g., a low voltage) is supplied to the emission control line Ei, the third transistor M3 is turned on to form the current path of the driving current. At this time, the first transistor M1 may control an amount of driving current flowing from the first power source ELVDD to the second power source ELVSS via the light emitting device EL in accordance to the voltage of the first node N1. Then, the light emitting device EL may generate light with a luminance corresponding to the driving current. When the data signal DS corresponding to a black gray scale is supplied to the first node N1, the first transistor M1 does not supply the driving current to the light emitting device EL. In this case, the light emitting device EL does not emit light, thereby displaying the black gray scale.

According to exemplary embodiments of the invention, the circuit structure of the sub-pixel SPX (or pixel PXL) is not limited that shown in FIG. 7, and the sub-pixel SPX (or pixel PXL) may include various types of pixel circuits known in the art.

When the display device 10 including the sub-pixels SPX (or pixels PXL) is driven in the second mode, the panel driving unit 210 may supply a sensing data signal to the display panel 110. Accordingly, light emitting devices EL disposed in the light emitting area SA may emit light in accordance to the sensing data signal. For example, the panel driving unit 210 may supply the voltage of the sensing data signal to the data lines Dj of sub-pixels SPX (or pixels PXL) disposed in the light emitting area SA during the second mode, while sequentially scanning the sub-pixels SPX (or the pixels PXL) of the light emitting area SA.

In some exemplary embodiments, the panel driving unit 210 may sequentially receive sensing signals from photo sensors PHS of the sub-pixels SPX disposed in the light emitting area SA, while allowing the sub-pixels SPX to emit light in units of horizontal lines along a direction substantially identical to the scanning direction. Alternatively, as the turn-on/turn-off of the third transistor M3 is controlled using the emission control signal, the light emitting area SA may be sensed at the same timing after light are simultaneously emitted from the sub-pixels SPX in the light emitting area SA.

For example, during a predetermined scanning period of one frame period 1F, the sub-pixels SPX may be sequentially scanned, while simultaneously supplying the emission control signal having the gate-off voltage to the sub-pixels SPX in the light emitting area SA. In addition, during a predetermined emission period subsequent to the scanning period, the emission control signal having the gate-on voltage is simultaneously supplied to the sub-pixels SPX, so that light can be simultaneously emitted from the sub-pixels SPX disposed in the light emitting area SA.

Figure 9:
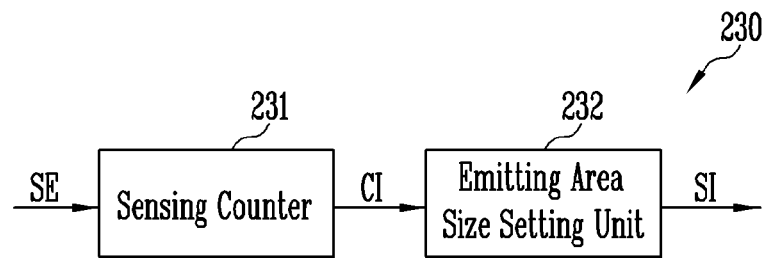
FIG. 9 is a view schematically showing an emitting area setting unit according to an exemplary embodiment of the invention.

FIG. 9 is a schematic view illustrating an emitting area setting unit 230 according to an exemplary embodiment of the invention. Referring to FIGS. 1, 2, and 9, the emitting area setting unit 230 may include a sensing counter 231 and an emitting area size setting unit 232.

The sensing counter 231 may receive a sensing enable signal SE. The sensing enable signal SE may be a signal corresponding to activation of the second mode of the display device 10. For example, the sensing enable signal SE may be generated when an application program requiring user verification is executed. In some exemplary embodiments, the sensing enable signal SE may be generated in a host system or the driving circuit 200, but the inventive concepts are not limited thereto.

The sensing counter 231 may count the number of times a fingerprint sensing operation has been executed based on the sensing enable signal SE. For example, the sensing counter 231 may count the number of times the fingerprint sensing operation was executed by counting the number of times the sensing enable signal SE is received. The sensing counter 231 may generate count information CI based on the counted result, and transmit the count information CI to the emitting area size setting unit 232.

The emitting area size setting unit 232 may receive the count information CI. For example, the count information CI may indicate the number of times the fingerprint sensing operation has been executed. The emitting area size setting unit 232 may then change the size of the light emitting area SA based on the count information CI. For example, the emitting area size setting unit 232 may increase or decrease the size of the light emitting area SA based on the number of times of the fingerprint sensing operation has been executed.

In some exemplary embodiments, the emitting area size setting unit 232 may increase or decrease the size of the light emitting area SA by a given change range. For example, the change range may be set to be 1% or more of the number of vertical pixels in the display panel 110. That is, if the number of vertical pixels of the display panel 110 is 3000, the change range may be set to be 30 or more. Therefore, the emitting area size setting unit 232 may increase or decrease the size of the light emitting area SA by at least 30 pixels. However, the inventive concepts are not limited thereto, and the change range may be various modified as desired.

The emitting area size setting unit 232 may divide a preset period value into the number of times the fingerprint sensing operation has been executed, which is included in the count information CI, and obtain a remainder. The emitting area size setting unit 232 may increase or decrease the size of the light emitting area SA by the change range in accordance to the remainder.

For example, when the period value is preset as 4, and the remainder is 0 or 1, the emitting area size setting unit 232 may increase the size of the light emitting area SA by the change range. When the remainder is 2 or 3, the emitting area size setting unit 232 may decrease the size of the light emitting area SA by the change range. Therefore, the more the fingerprint sensing operation has been executed, the size of the light emitting area SA may be increased or decreased.

In another exemplary embodiment, the emitting area size setting unit 232 may change the size of the light emitting area SA into preset size values, based on the number of times the fingerprint sensing operation has been executed. At this time, the size values may be stored in a memory. For example, the size values may be stored in a lookup table stored in the memory.

For example, the emitting area size setting unit 232 may divide a preset period value into the number of times the fingerprint sensing operation has been executed, which is included in the count information CI, and obtain a remainder. The emitting area size setting unit 232 may change the size of the light emitting area SA into size values corresponding to the remainder. At this time, the size values may be preset, such that the size of the light emitting area SA is increased or decreased as the number of times the fingerprint sensing operation is executed increases.

The emitting area size setting unit 232 may generate size information SI including information on the size of the light emitting area SA. For example, the emitting area size setting unit 232 may transmit the size information SI to the panel driving unit 210. Accordingly, the panel driving unit 210 can supply the sensing data signal, such that the luminance of the light emitting area SA is increased based on the size information SI. Further, the panel driving unit 210 can supply the sensing data signal to the pixels PXL in the preset light emitting area SA corresponding to the second mode.

Figure 10A:
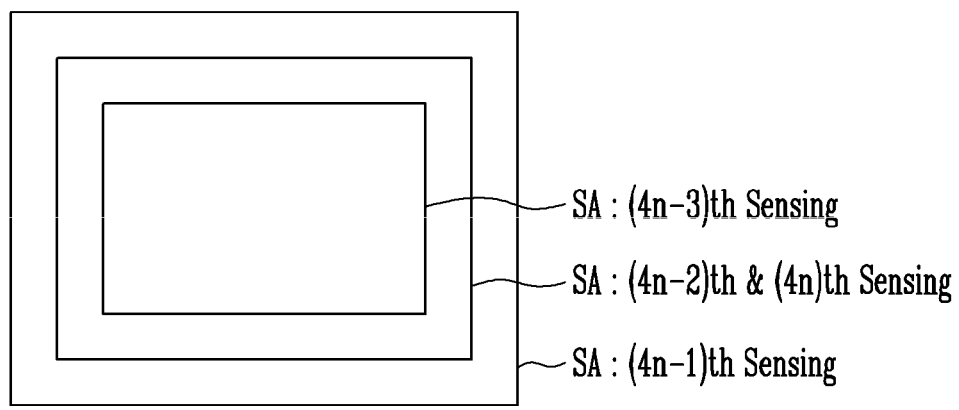
FIGS. 10A and 10B are views illustrating an operation of the emitting area setting unit according to exemplary embodiments of the invention.
Figure 10B:
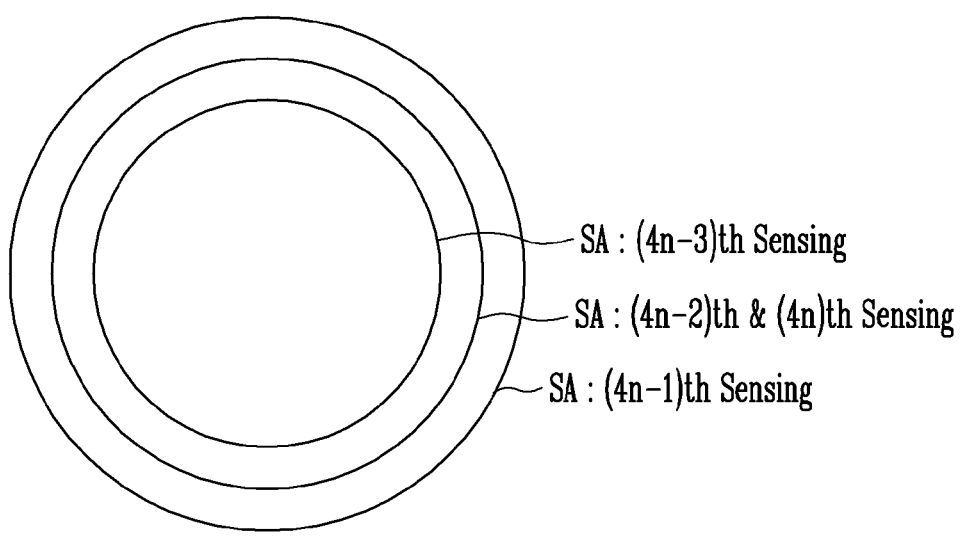

FIGS. 10A and 10B are views illustrating an operation of the emitting area size setting unit 232 according to exemplary embodiments of the invention. Referring to FIGS. 9, 10A, and 10B, the emitting area size setting unit 232 may change the size of the light emitting area SA based on the number of times the fingerprint sensing has been executed. In FIGS. 10A and 10B, the light emitting areas SA are shown as having a quadrangular shape and a circular shape, respectively. However, the inventive concepts are limited thereto, and the light emitting area SA may have various shapes.

Hereinafter, changing the size of the light emitting area SA will be described with reference to the period value being set as 4, as described in FIG. 9. For example, in a $(4n-3)^{th}$ fingerprint sensing operation (n is a natural number), the size of the light emitting area SA may be set as a reference size (i.e., an innermost quadrangle or circle).

In a $(4n-2)^{th}$ fingerprint sensing operation, the size of the light emitting area SA may be increased than that in the $(4n-3)^{th}$ fingerprint sensing operation. In some exemplary embodiments, the size of the light emitting area SA may be increased by a change range. For example, the change range may be set as 1% or more of the number of vertical pixels of the display panel 110.

In a $(4n-1)^{th}$ fingerprint sensing operation, the size of the light emitting area SA may be further increased than that in the $(4n-2)^{th}$ fingerprint sensing operation. In some exemplary embodiments, the area of the light emitting area SA may be increased by the change range.

In a $(4n)^{th}$ fingerprint sensing operation, the size of the light emitting area SA may be decreased than that in the $(4n-1)^{th}$ fingerprint sensing operation. In some exemplary embodiments, the size of the light emitting area SA may be decreased by the change range. In this manner, as the number of times the fingerprint sensing operation is executed increases, the size of the light emitting area SA may be increased or decreased.

Figure 11:
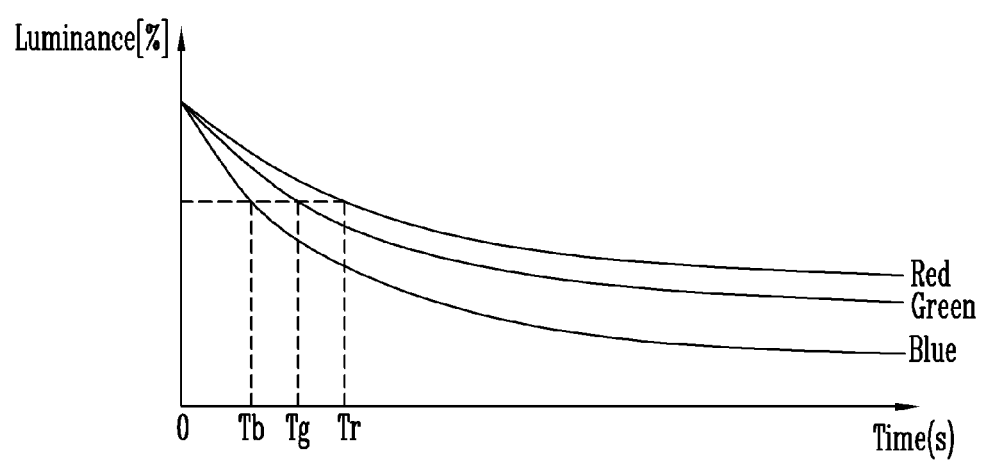
FIG. 11 is a graph showing the degradation coefficient of each color according to an exemplary embodiment of the invention.

FIG. 11 is a graph showing the degradation coefficient of each color according to an exemplary embodiment of the invention.

Referring to FIGS. 1, 2, and 11, during the second mode, the color matching unit 240 may change the luminance of each color of the light emitting devices. That is, the color matching unit 240 may change the luminance for each color, such that the light emitting devices have substantially the same degradation degree for each color over time.

For example, the color matching unit 240 may set red as a reference color, set any one of blue and green as a target color, and change the luminance of the target color using Equation 1.

$$Lt'=Lt*(Tt/Tr)^{(1/Acc\_t)}$$ [Equation 1]

Herein, Lt' denotes a luminance of the changed target color, Lt denotes a luminance of the target color before the change, Acc_t denotes a luminance acceleration coefficient of the target color, Tt denotes a degradation coefficient of the target color, and Tr denotes a degradation coefficient of the reference color.

The degradation coefficient Tt of the target color may be set as follows. As shown in FIG. 11, a red degradation coefficient Tr, a green degradation coefficient Tg, or a blue degradation coefficient Tb may correspond to a time value for emitting light of a corresponding color at a specific luminance due to degradation of light emitting devices over time.

For example, the red degradation coefficient Tr may correspond to a time value until light with a specific luminance is emitted due to degradation of a red light emitting device. The green degradation coefficient Tg may correspond to a time value until light with the specific luminance is emitted due to degradation of a green light emitting device. The blue degradation coefficient Tb may correspond to a time value until light with the specific luminance is emitted due to degradation of a blue light emitting device.

In general, as shown in FIG. 11, the red degradation coefficient Tr may be greater than the green degradation coefficient Tg, and the green degradation coefficient Tg may be greater than the blue degradation coefficient Tb.

For example, the luminance acceleration coefficient Acc_t for each color may be constant when a product is released. However, the inventive concepts are not limited thereto, and the luminance acceleration coefficient Acc_t may be a value that may be calculated and changed even after the products are released.

A display device constructed according to the principles of the invention may include a fingerprint sensor capable of detecting a fingerprint of a user by using light emitted from the pixels without any separate light source. Accordingly, the thickness of the display device may be decreased, and manufacturing costs of the display device may also be reduced.

Further, some of the additional advantages that may be achieved by exemplary embodiments of the invention include changing the size of the light emitting area whenever the fingerprint sensing operation is performed during a fingerprint sensing period, which may reduce the occurrence of an after image at the boundary portion of the light emitting area from device degradation.

Further, according to exemplary embodiments of the invention, the luminance for each color of the light emitting devices may be changed, which may prevent a color difference phenomenon.

Although certain exemplary embodiments have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
   a display panel having a display area including pixels in an emitting area corresponding to a sensor area, each of the pixels including a first sub-pixel, a second sub-pixel, and a third sub-pixel to emit, respectively, any one of red light, green light, and a blue light;
   a layer disposed on the display panel and comprising photo sensors to generate sensing signals upon activation thereof;
   a panel driving unit to supply a first signal during a first mode, to display an image in the display area and supply a second signal during a second mode sensing a fingerprint, to increase a luminance of the emitting area;
   a detecting unit to perform a fingerprint sensing operation to detect the fingerprint, during the second mode based on the sensing signals received from the photo sensors;
   a setting unit to change a characteristic of the emitting area in response to the fingerprint sensing operation; and
   a color matching unit to change a luminance of at least one of the first sub-pixel, the second sub-pixel, and the third sub-pixel in the sensor area during the second mode such that the pixels have the same degree of degradation for each color of light and to adjust a voltage of the second signal supplied to each of the pixels.

2. The display device of claim 1, wherein the characteristic is a size, and the setting unit is configured to increase or decrease a size of the emitting area based on the fingerprint sensing operation.

3. The display device of claim 1, wherein the setting unit comprises:
a sensing counter configured to generate count information indicating a number of times the fingerprint sensing operation is performed; and
a size setting unit configured to change a size of the emitting area based on the count information.

4. The display device of claim 3, wherein the size setting unit is further configured to increase or decrease the size of the emitting area based on the number of times the fingerprint sensing operation is performed.

5. The display device of claim 4, wherein the setting unit is further configured to change the size of the emitting area by a preset range based on the number of times the fingerprint sensing operation is performed.

6. The display device of claim 5, wherein the preset range is set to 1% or more of a number of vertical pixels in the display panel.

7. The display device of claim 4, wherein the setting unit is further configured to change the size of the emitting area into preset size values based on the number of times the fingerprint sensing operation is performed.

8. The display device of claim 1, wherein:
the photo sensors are disposed in the sensor area; and
a center of the emitting area coincides with a center of the sensor area.

9. The display device of claim 1, wherein a shape of the emitting area is substantially quadrangular or substantially circular.

10. The display device of claim 1, wherein the color matching unit is configured to:
set the red light as a reference color;
set the green light or the blue light as a target color; and
change a luminance of the target color to match a luminance of the reference color according to Equation 1:

$$Lt'=Lt*(Tt/Tr)^{(1/Acc\_t)},$$

wherein Lt' denotes a luminance of the changed target color, Lt denotes a luminance of the target color before the change, Acc_t denotes a luminance acceleration coefficient of the target color, Tt denotes a degradation coefficient of the target color, and Tr denotes a degradation coefficient of the reference color.

11. The display device of claim 10, wherein the degradation coefficient corresponds to a time value for emitting light of predetermined luminance.

12. A display device having an integrated fingerprint sensor and a single light source, the display device comprising:

a display panel comprising a display area including an emitting area corresponding to a sensor area and the sensor area, pixels disposed in the display area defining the single light source, each of the pixels including a first sub-pixel, a second sub-pixel, and a third sub-pixel to emit, respectively, any one of red light, green light, and blue light, and photo sensors disposed in the sensor area to perform a fingerprint sensing operation; and
a driving circuit to:
generate a first signal during a first mode to display an image in the display area;
generate a second signal during a second mode sensing a fingerprint to increase a luminance of the emitting area;
change a characteristic of the emitting area based on performance of the fingerprint sensing operation; and
change a luminance of at least one of the first sub-pixel, the second sub-pixel, and the third sub-pixel in the sensor area during the second mode such that the pixels have the same degree of degradation for each color of light and to adjust a voltage of the second signal supplied to each of the pixels.

13. The display device of claim 12, wherein the driving circuit is configured to increase or decrease a size of the emitting area based on the fingerprint sensing operation.

14. A method of driving a display device having a display panel including pixels in an emitting area corresponding to a sensor area and an integrated fingerprint detector having sensors, the method comprising the steps of:
supplying a first signal to the pixels to display an image in a first mode, each of the pixels including a first sub-pixel, a second sub-pixel, and a third sub-pixel to emit, respectively, any one of red light, green light, and blue light;
supplying a second signal to the pixels in a second mode sensing a fingerprint to cause the pixel to emit light of a greater luminance than during the first mode;
generating a third signal in the sensors in response to light emitted from the pixels and reflected from an external object to the sensors; and
detecting a pattern of the external object based upon at least one of an amount and a waveform of the reflected light incident onto the sensors,
wherein a luminance of at least one of the first sub-pixel, the second sub-pixel, and the third sub-pixel in the sensor area is changed during the second mode, such that the pixels have the same degree of degradation for each color of light and to adjust a voltage of the second signal supplied for each of the pixels, and
wherein a characteristic of the emitting area is changed during the second mode.

15. The method of claim 14, wherein a size of the emitting area is changed during the second mode.

* * * * *